(12) United States Patent
Chee et al.

(10) Patent No.: US 10,355,384 B2
(45) Date of Patent: Jul. 16, 2019

(54) INTEGRATED CONNECTOR FOR ELECTRONIC DEVICE

(71) Applicant: Intel Corporation, Santa Clara, CA (US)

(72) Inventors: Kit Chew Chee, Georgetown (MY); Ahmad Jalaluddin Yusof, Prai (MY); Tin Poay Chuah, Bayan Baru (MY)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/751,018

(22) PCT Filed: Sep. 23, 2015

(86) PCT No.: PCT/IB2015/057329
§ 371 (c)(1),
(2) Date: Feb. 7, 2018

(87) PCT Pub. No.: WO2017/051215
PCT Pub. Date: Mar. 30, 2017

(65) Prior Publication Data
US 2018/0233841 A1  Aug. 16, 2018

(51) Int. Cl.
*H01R 3/00* (2006.01)
*H01R 12/77* (2011.01)
*H01R 12/79* (2011.01)
*H05K 1/11* (2006.01)
*H01R 13/627* (2006.01)
(Continued)

(52) U.S. Cl.
CPC ........... *H01R 12/774* (2013.01); *H01R 12/79* (2013.01); *H05K 1/117* (2013.01); *H01R 13/6275* (2013.01); *H01R 2107/00* (2013.01); *H05K 1/118* (2013.01); *H05K 3/4697* (2013.01); *H05K 2201/09127* (2013.01); *H05K 2201/09163* (2013.01); *H05K 2201/09481* (2013.01); *H05K 2201/1034* (2013.01)

(58) Field of Classification Search
CPC .... H01R 12/774; H01R 12/79; H01R 12/585; H01R 12/57; H05K 1/118; H05K 7/10; H05K 1/117; H05K 2201/1034; H05K 2201/09163; H05K 2201/09481
See application file for complete search history.

(56) References Cited

U.S. PATENT DOCUMENTS

| 7,247,034 B2 * | 7/2007 | Matsuzaki | ............. H01R 12/79 174/254 |
| 7,944,707 B2 * | 5/2011 | Hung | ...................... H01L 23/13 174/260 |

(Continued)

FOREIGN PATENT DOCUMENTS

| JP | 06-177497 A | 6/1994 |
| JP | 2005-051169 A | 2/2005 |
| WO | 2017/051215 A1 | 3/2017 |

*Primary Examiner* — Jean F Duverne
(74) *Attorney, Agent, or Firm* — Jaffery, Watson, Mendonsa & Hamilton LLP

(57) ABSTRACT

In one example an electronic device comprises a chassis and a printed circuit board coupled to the chassis and comprising a body formed from a plurality of laminate layers, and at least one receptacle formed in the body and comprising at least one data connector positioned in the receptacle to provide a communication connection. Other examples may be described.

16 Claims, 13 Drawing Sheets

(51) Int. Cl.
*H01R 107/00* (2006.01)
*H05K 3/46* (2006.01)

(56) References Cited

U.S. PATENT DOCUMENTS

| | | | |
|---|---|---|---|
| 7,965,366 B2 * | 6/2011 | Shie | H05K 3/361 |
| | | | 349/149 |
| 9,048,565 B2 * | 6/2015 | Palaniappa | H01R 12/57 |
| 9,651,986 B2 * | 5/2017 | Koide | G06F 1/1616 |
| 9,806,443 B1 * | 10/2017 | Thackston | H01R 12/585 |
| 9,877,404 B1 * | 1/2018 | Palaniappa | H05K 7/10 |
| 2007/0037440 A1 * | 2/2007 | Uchida | H01R 12/79 |
| | | | 439/495 |
| 2008/0153319 A1 | 6/2008 | Uchida et al. | |
| 2008/0297112 A1 * | 12/2008 | Cordes | H02J 7/0073 |
| | | | 320/128 |
| 2013/0319739 A1 | 12/2013 | Arnold | |
| 2014/0295697 A1 | 10/2014 | Niitsu et al. | |

\* cited by examiner

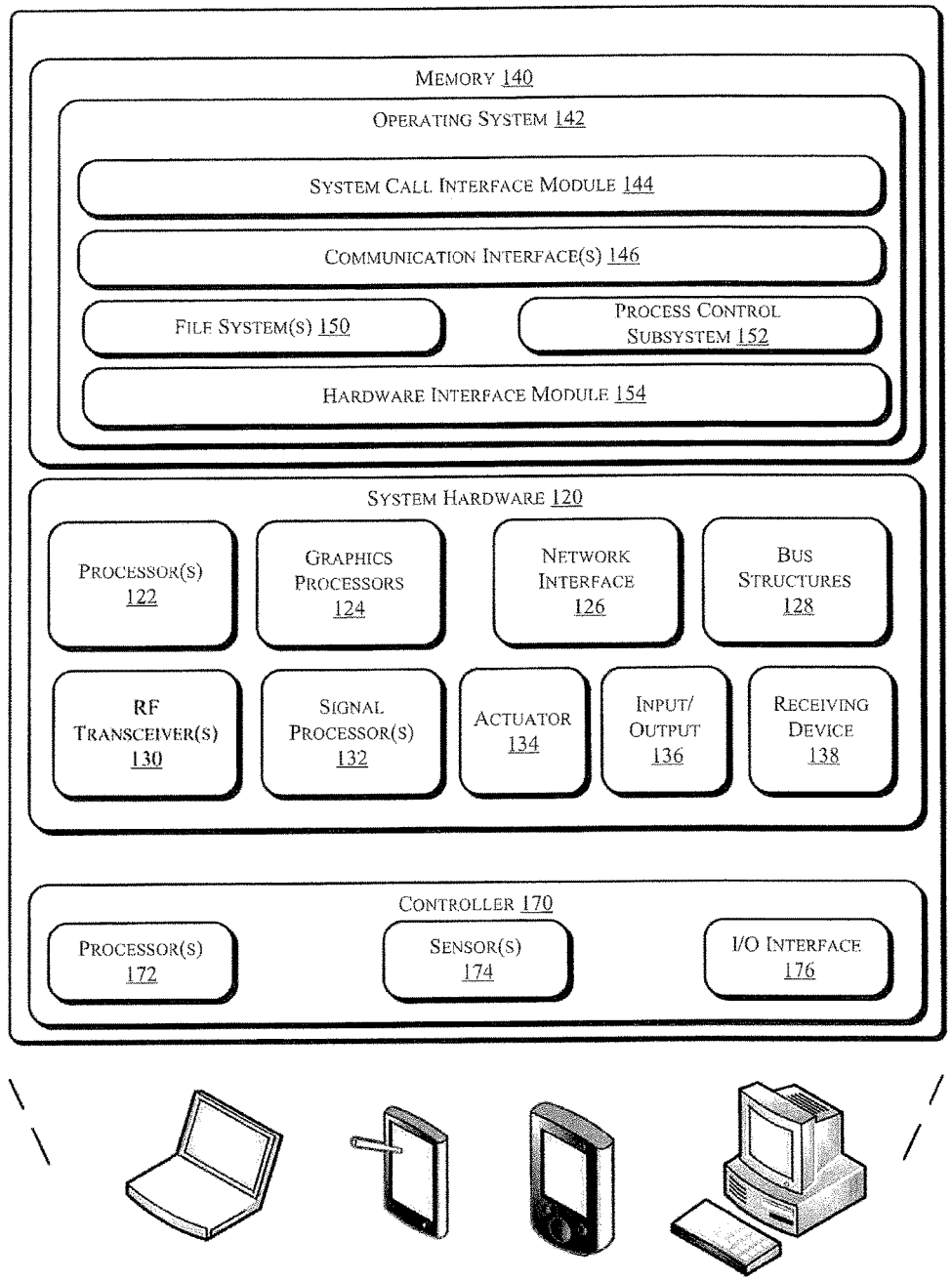
FIG. 1     ELECTRONIC DEVICE 100

INTEGRATED CONNECTOR FOR ELECTRONIC DEVICE

This application claims priority under 35 U.S.C. § 371 to International Application No. PCT/IB2015/057329 filed Sep. 23, 2015, entitled INTEGRATED CONNECTOR FOR ELECTRONIC DEVICE. The entire disclosure(s) of these documents are incorporated by reference herein for all purposes.

TECHNICAL FIELD

The subject matter described herein relates generally to the field of electronic devices and more particularly to an integrated connector for electronic devices.

BACKGROUND OF THE INVENTION

Increases in demand for mobile electronic devices drives corresponding demand for thin form factor electronic devices. In some cases electrical connectors may be a limiting factor in reducing the thickness of an electronic device. Accordingly, integrated connectors for electronic devices may find utility.

BRIEF DESCRIPTION OF THE DRAWINGS

The detailed description is described with reference to the accompanying figures.

FIG. 1 is a schematic illustration of an electronic device which may be adapted to implement an integrated connector for an electronic device in accordance with some examples.

DETAILED DESCRIPTION

Figure 2A:
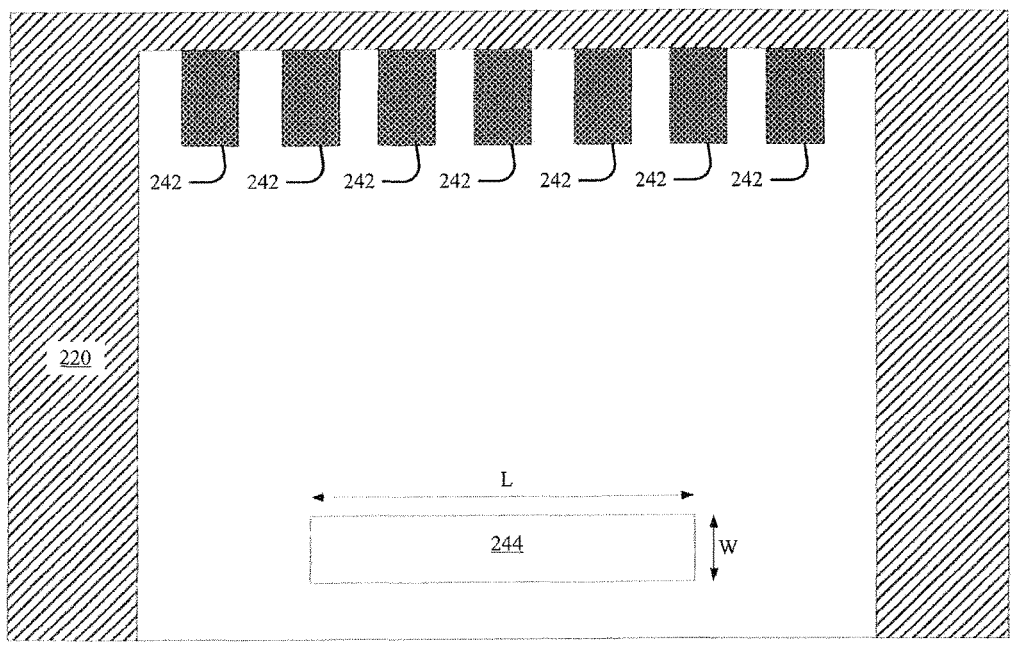
FIG. 2A is a schematic illustration of a top view of an integrated connector for an electronic device in accordance with some examples.
Figure 2B:
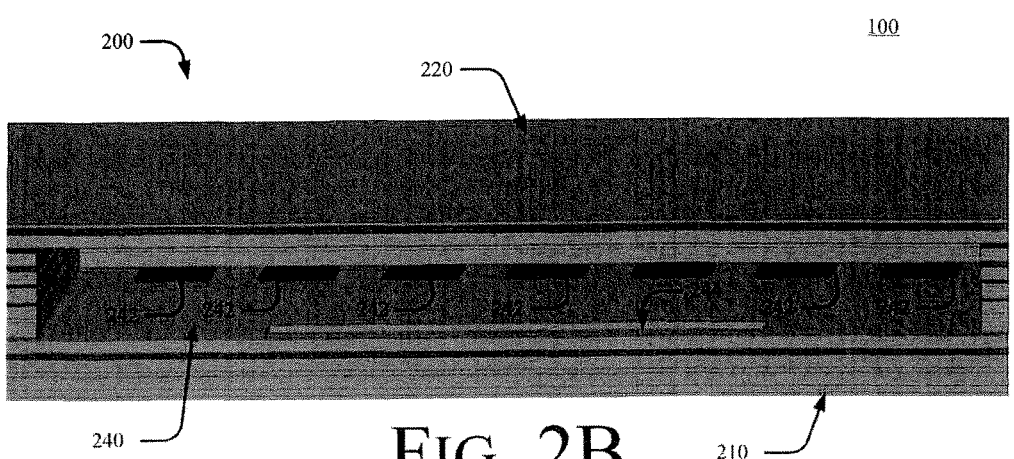
FIG. 2B is a schematic illustration of a perspective view of an integrated connector for an electronic device in accordance with some examples.

Described herein are exemplary systems and methods to implement an integrated connector in electronic devices. In the following description, numerous specific details are set forth to provide a thorough understanding of various examples. However, it will be understood by those skilled in the art that the various examples may be practiced without the specific details. In other instances, well-known methods, procedures, components, and circuits have not been illustrated or described in detail so as not to obscure the particular examples.

As described above, in some cases electrical connectors may be a limiting factor in reducing the thickness of an electronic device. To address this issue, in some examples a printed circuit board may be provided with an integrated electrical connector formed in the a body of the printed circuit board and comprising at least one data connector to provide a communication connection. Additional features and operating characteristics of the electronic device and associated system are described below with reference to FIGS. 1-10.

FIG. 1 is a schematic illustration of an electronic device which may be adapted to implement an integrated connector for an electronic device in accordance with some examples. In various examples, electronic device 100 may include or be coupled to one or more accompanying input/output devices including a display, one or more speakers, a keyboard, one or more other I/O device(s), a mouse, a camera, or the like. Other exemplary I/O device(s) may include a touch screen, a voice-activated input device, a track ball, a geolocation device, an accelerometer/gyroscope, biometric feature input devices, and any other device that allows the electronic device 100 to receive input from a user.

The electronic device 100 includes system hardware 120 and memory 140, which may be implemented as random access memory and/or read-only memory. A file store may be communicatively coupled to electronic device 100. The file store may be internal to electronic device 100 such as, e.g., eMMC, SSD, one or more hard drives, or other types of storage devices. Alternatively, the file store may also be external to electronic device 100 such as, e.g., one or more external hard drives, network attached storage, or a separate storage network.

System hardware 120 may include one or more processors 122, graphics processors 124, network interfaces 126, and bus structures 128. In one embodiment, processor 122 may be embodied as an Intel® Atom™ processors, Intel® Atom™ based System-on-a-Chip (SOC) or Intel® Core2 Duo® or i3/i5/i7 series processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations. Graphics processor(s) 124 may be integrated onto the motherboard of electronic device 100 or may be coupled via an expansion slot on the motherboard or may be located on the same die or same package as the Processing Unit.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 120. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MCA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI), a High Speed Synchronous Serial Interface (HSI), a Serial Low-power Inter-chip Media Bus (SLIMbus®), or the like.

Electronic device 100 may include an RF transceiver 130 to transceive RF signals, and a signal processing module 132 to process signals received by RF transceiver 130. RF transceiver may implement a local wireless connection via a protocol such as, e.g., Bluetooth or 802.11X. IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a WCDMA, LTE, general packet radio service (GPRS) interface (see, e.g., Guidelines on GPRS Handset Requirements, Global System for Mobile Communications/GSM Association, Ver. 3.0.1, December 2002).

Electronic device 100 may further include one or more actuators 134 and one or more input/output interfaces 136 such as, e.g., a keypad and/or a display. In some examples electronic device 100 may not have a keypad and use the touch panel for input.

Electronic device 100 may further include at least one wireless power receiving device 138 to receive power via an electromagnetic coupling with a driven coil in a charging device. The wireless power receiving device 138 may comprise one or more coil(s) to receive power through an inductive coupling with a driven coil or coupling charge plate(s) to receive power through a capacitive coupling with a driven capacitor in the charging device.

Memory 140 may include an operating system 142 for managing operations of electronic device 100. In one embodiment, operating system 142 includes a hardware interface module 154 that provides an interface to system hardware 120. In addition, operating system 142 may include a file system 150 that manages files used in the operation of electronic device 100 and a process control subsystem 152 that manages processes executing on electronic device 100.

Operating system 142 may include (or manage) one or more communication interfaces 146 that may operate in conjunction with system hardware 120 to transceive data packets and/or data streams from a remote source. Operating system 142 may further include a system call interface module 144 that provides an interface between the operating system 142 and one or more application modules resident in memory 140. Operating system 142 may be embodied as a UNIX operating system or any derivative thereof (e.g., Linux, Android, etc.) or as a Windows® brand operating system, or other operating systems.

In some examples an electronic device may include a controller 170, which may comprise one or more controllers that are separate from the primary execution environment. The separation may be physical in the sense that the controller may be implemented in controllers which are physically separate from the main processors. Alternatively, the trusted execution environment may logical in the sense that the controller may be hosted on same chip or chipset that hosts the main processors.

By way of example, in some examples the controller 170 may be implemented as an independent integrated circuit located on the motherboard of the electronic device 100, e.g., as a dedicated processor block on the same SOC die. In other examples the trusted execution engine may be implemented on a portion of the processor(s) 122 that is segregated from the rest of the processor(s) using hardware enforced mechanisms. In the embodiment depicted in FIG. 1 the controller 170 comprises a processor 172, a sensor 174, and an I/O interface 176.

One example of an integrated electrical connector for an electronic device adapted to implement electrostatic discharge will be described with reference to FIGS. 2A-2D and 3A-3D. Referring to FIGS. 2A-2D and 3A-3D, in one example an printed circuit board 200 may be coupled to a chassis of an electronic device 100 and may comprise a body 220 formed from a plurality of laminate layers and at least one receptacle 240 formed in a side surface 210 of the body 220 and comprising at least one data connector 242 positioned in the receptacle 240 to provide a communication connection.

While the specific configuration of the electrical connector is not critical, in some examples the receptacle 240 comprises at least one of a power receptacle, a universal serial bus (USB) receptacle, an audio/visual (AV) receptacle, or an Ethernet receptacle. In other examples the receptacle may comprise a differential interconnect such as PCIE, SATA or even single-ended interconnects or any other interconnect that utilizes a flex cable to connect host with an add in card, I/O board, device or module. The receptacle 240 may comprise between 1 and 100 connector pads 242, which in some examples may formed as a trace on the printed circuit board 200.

In some examples the receptacle 240 may comprise a locking slot 244 to receive a locking pin 262 mounted on a flex cable 250 which fits into the receptacle 240. While the particular configuration of the locking slot 244 is not critical, in some examples the locking slot has a length, L, which measures between about 1.5 millimeters and 7 millimeters and a width, W, which measures between about 0.2 millimeters and 1.0 millimeters. In one example the locking slot 244 measures approximately 3 millimeters in length by 0.6 millimeters in width.

Figure 2C:
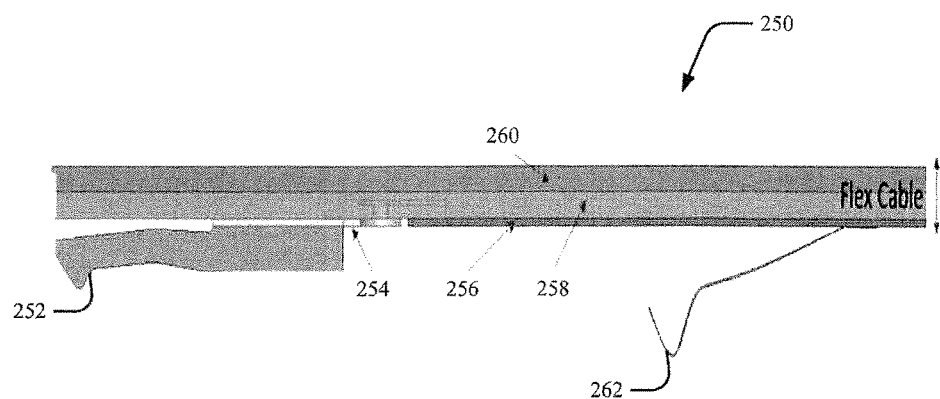
FIG. 2C is a schematic illustration of a side view of a flex cable with contact pins for an integrated connector for an electronic device in accordance with some examples.
Figure 2D:
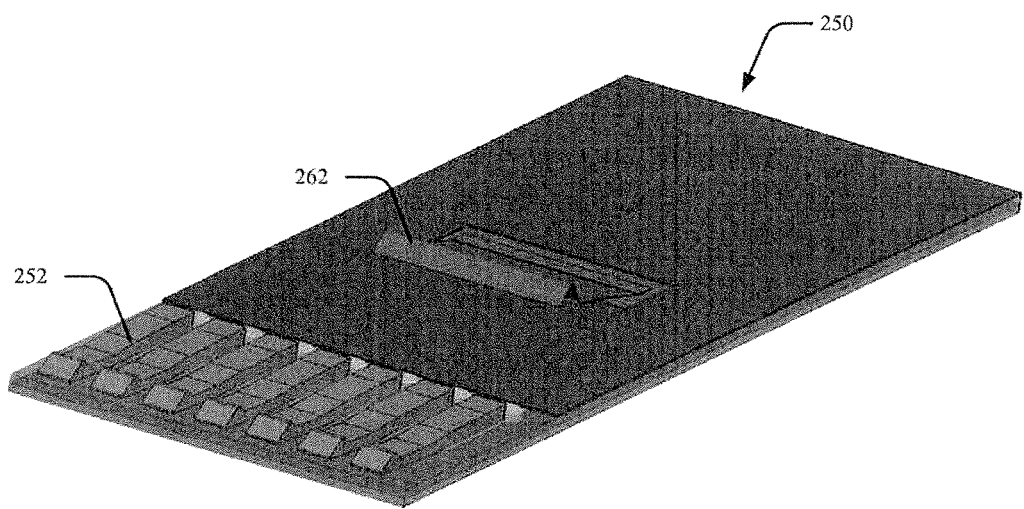
FIG. 2D is a schematic illustration of a perspective view of a flex cable with contact pins for an integrated connector for an electronic device in accordance with some examples.

Referring to FIGS. 2C-2D, in some examples a flex cable 250 adapted to be inserted into the receptacle 240 may comprise a body 260 formed from a relatively rigid material, e.g., a rigid metal or polymer, to provide a degree of structural rigidity.

Flex cable 250 may further comprise a flex cable 258 which may comprise a plurality of conductive leads which are, in turn, electrically coupled to a plurality of contact pins 252 via conductive pads 254. A ground plane 256 is disposed on one side of the flex cable 258.

Figure 3A:
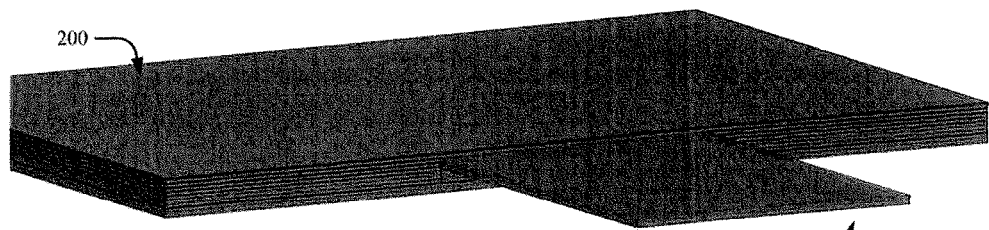
FIGS. 3A-3D are schematic illustrations of a perspective views of an integrated connector for an electronic device in accordance with some examples.
Figure 3B:
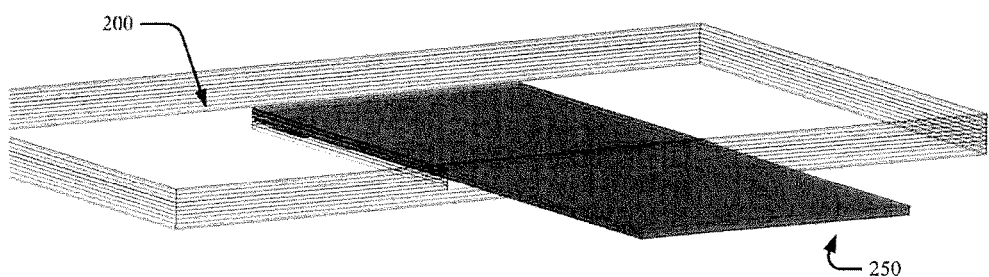
Figure 3C:
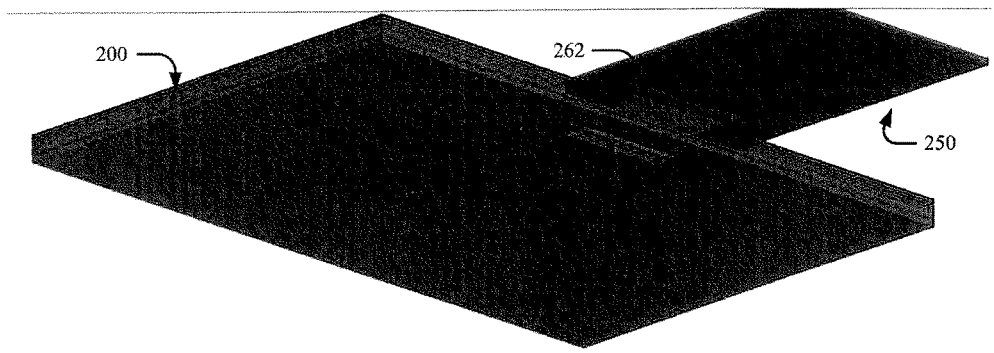
Figure 3D:
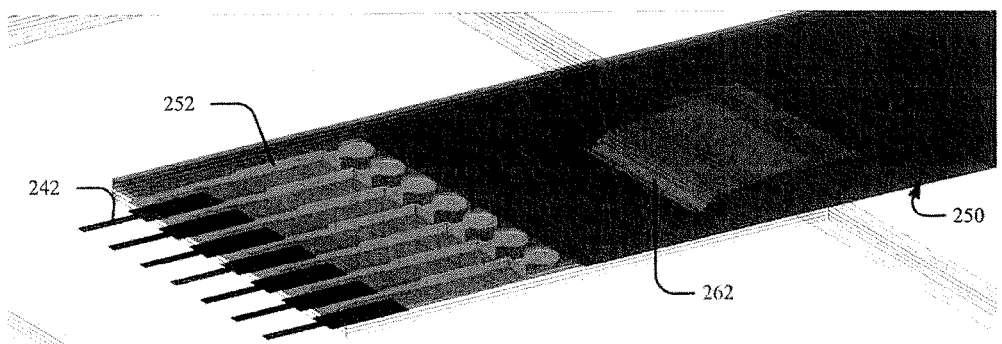

In some examples the flex cable 250 comprises a locking pin 262 which extends from a surface of the flex cable 250 and is positioned and dimensioned to mate with the locking slot 244 when the flex cable 250 is inserted into the receptacle 240. The locking pin 262 may be formed from a semi-rigid material, e.g., a polymer or a metal, and may be biased in a first direction such that the locking pin is in a first position, as depicted in FIG. 2C, when in a resting state. The locking pin 262 may be positioned such that inserting the connector into the receptacle as illustrated in FIGS. 3A and 3C moves the locking pin 262 from the first position to a second position, closer to the ground plane 256, in which the locking pin 262 is under strain. As illustrated in FIGS. 3B and 3D, when the flex cable 250 is fully inserted into the receptacle 240 the locking pin is positioned such that the locking pin 262 is over the locking slot 244 such that the locking pin 262 moves from the second position back to the first position, thereby holding the connector in place in the receptacle 240.

Figure 4A:
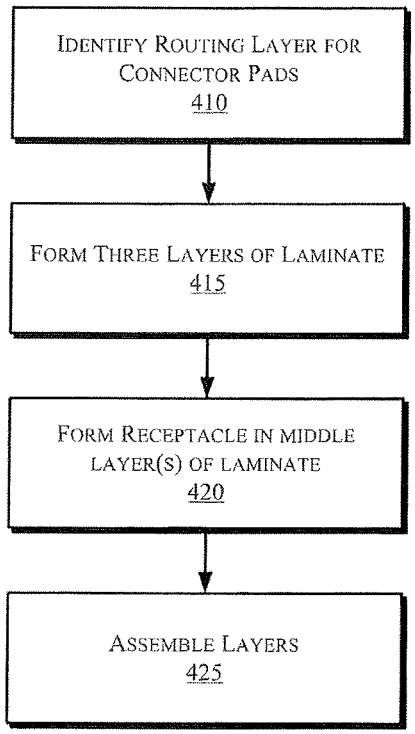
FIGS. 4A-4B are flowcharts illustrating operations in methods to manufacture an integrated connector for an electronic device in accordance with some examples.
Figure 4B:
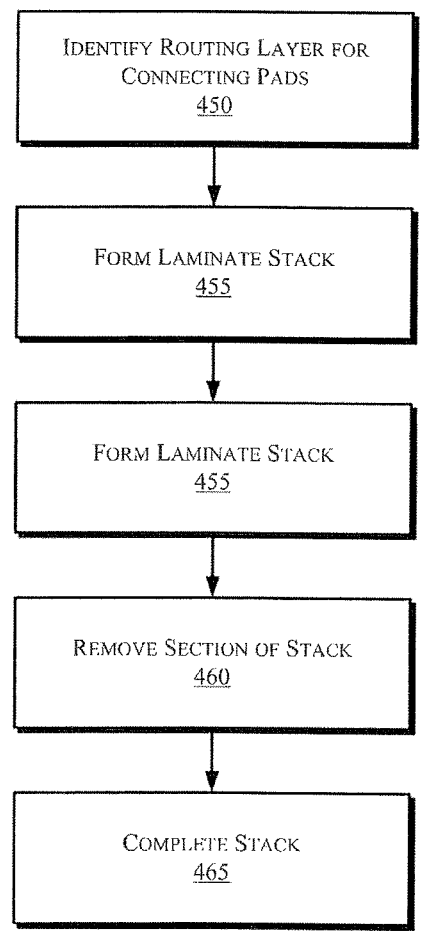

FIGS. 4A-4B are flowcharts illustrating operations in methods to manufacture an integrated connector for an electronic device in accordance with some examples. In a first example, the printed circuit board 200 is formed from multiple laminate layers and the receptacle 240 is formed by removing a portion of the at least one of the laminate layers before the printed circuit board 200 is assembled. Referring to FIG. 4A, at operation 410 a routing layer for the connecting pads 242 on the printed circuit board 200 is identified.

Figure 5A:
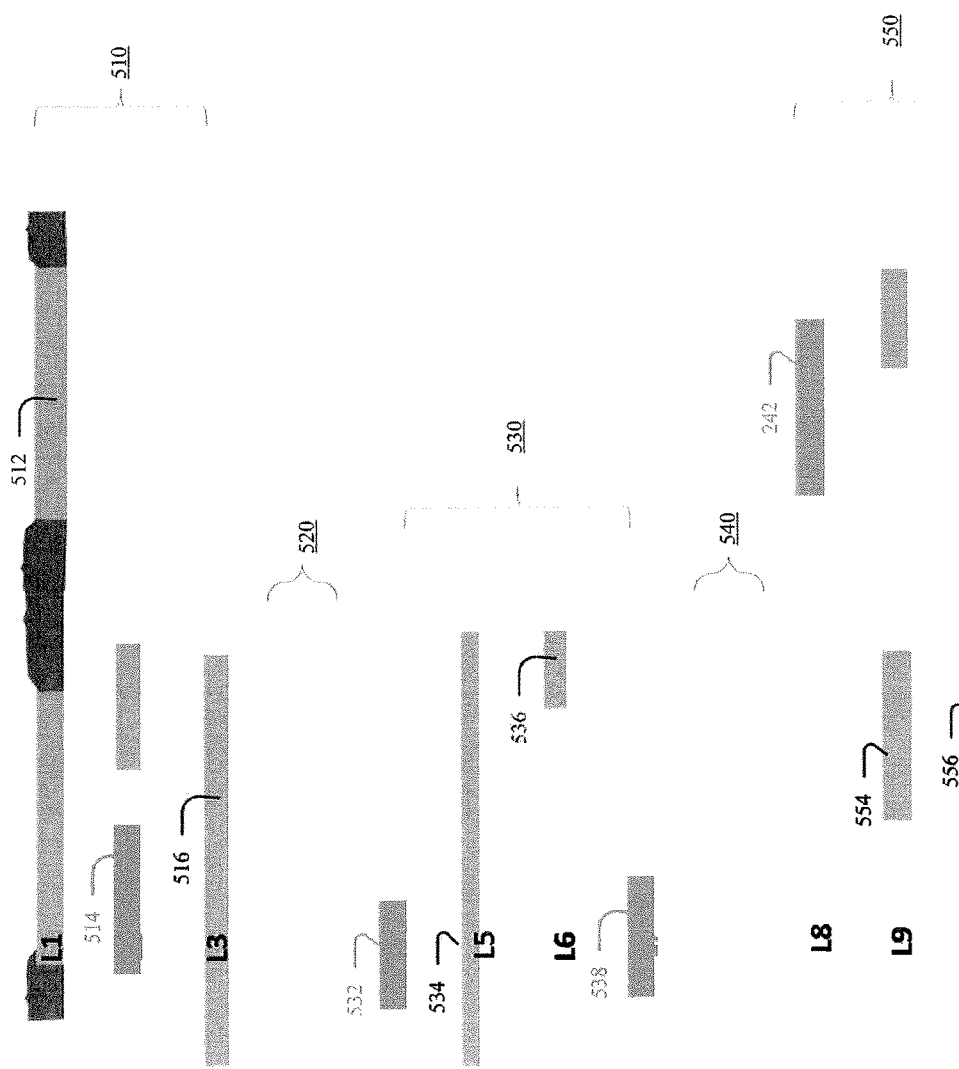
FIGS. 5A-5C are schematic illustrations of side views of examples of an integrated connector for an electronic device in accordance with some examples.

As illustrated in FIG. 5A, in one example the printed circuit board 200 may be formed (operation 415) from three separate laminates, each laminate consists of a plurality of layers, one or more of which may be dimensioned to form the receptacle 240 upon assembly of the printed circuit board 200. In some examples the number of layers in the respective laminates is determined by the total thickness needed for the receptacle, which corresponds to the flex cable thickness which including the contact pins 252 and locking slot 262 A first laminate 510 comprises three routing layers labeled L1, L2, and L3, each of which may include respective circuit traces 512, 514, 516. A second laminate 530 comprises four routing layers labeled L4, L5, L6 and L7, each of which may include respective circuit traces 532, 534, 536, and 538. A third laminate 550 comprises three routing layer labeled L8, L9, and L10. The routing layer identified as L8 includes the contact pads 242 defined as circuit traces. The remaining routing layers include each may include respective circuit traces 514, 516. One or more additional layers 520, 540 of a dielectric material may be incorporated into the printed circuit board 200. The circuit traces on the various routing layers L1 through L10, including connecting pads 242, may be formed using conventional circuit forming techniques, e.g., by etching a copper core laminate or depositing conductive traces on a laminate layer.

At operation 420 the receptacle is formed in one or more middle layers of the laminate stack. In some examples the receptacle may be formed by removing a portion of the second laminate 530 and one or more of the additional layers 520, 540. In other examples the second laminate 530 and one or more of the additional layers 520, 540 may be manufactured at a dimension that is smaller than the first laminate 510 and the third laminate 550. The dimension of the receptacle is determined by the thickness of the flex cable 250. At operation 425 the layers are assembled to form the printed circuit board 200 including the receptacle 240.

In another example the receptacle 240 may be formed in the printed circuit board 200 using a material removal process such as a laser cutting process. Referring to FIG. 4B, at operation 450 a routing layer for the connecting pads 242 on the printed circuit board 200 is identified. At operation 455 the laminate stack which forms the printed circuit board is formed.

Figure 5B:
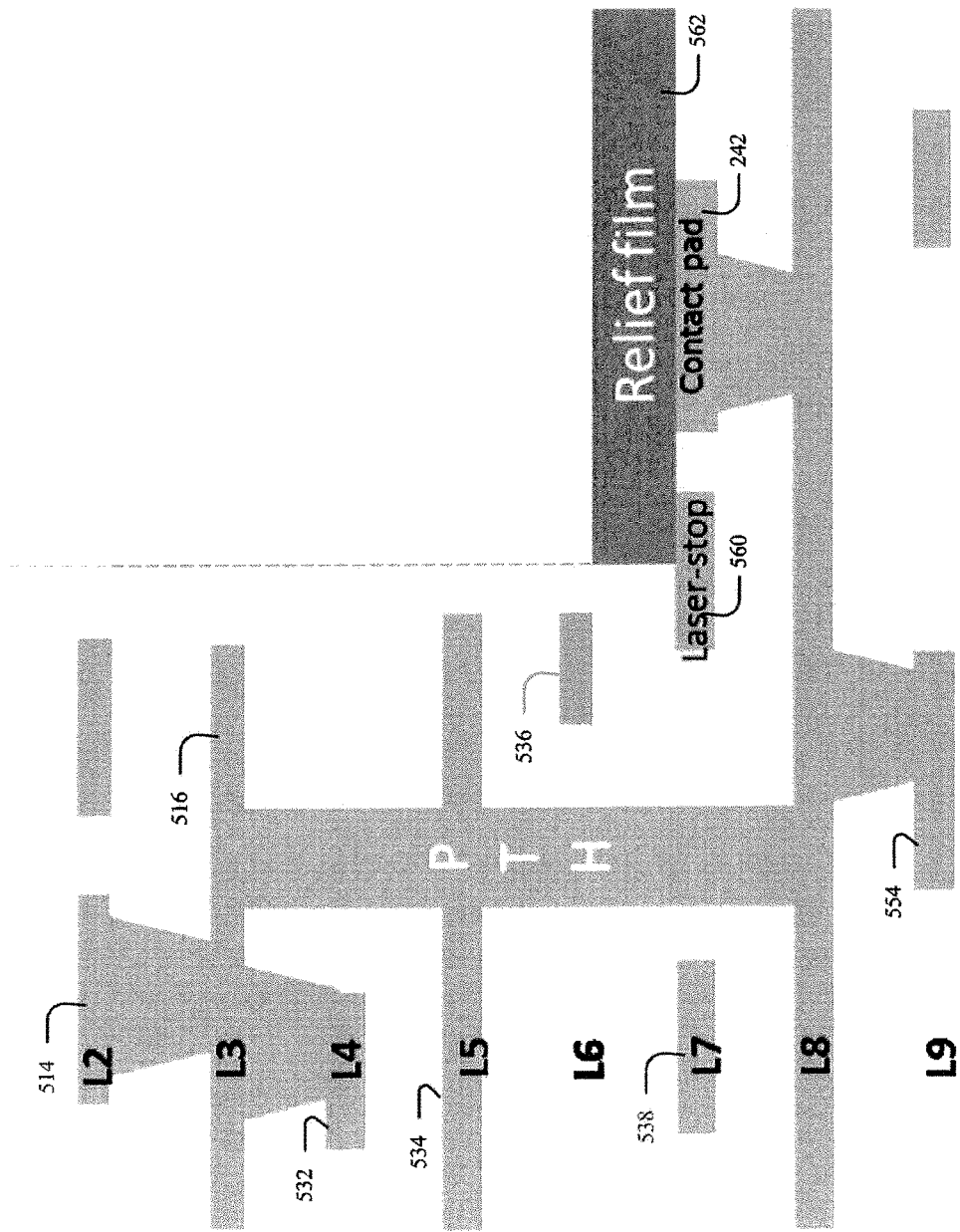

As illustrated in FIG. 5B, in one example the printed circuit board 200 may be formed (operation 415) in a stack which includes routing layers L2-L9 of printed circuit board 200. As described above, the circuit traces on the various routing layers L1 through L10, including connecting pads 242, may be formed using conventional circuit forming techniques, e.g., by etching a copper core laminate or depositing conductive traces on a laminate layer. A laser stop 560 is formed in the routing layer which includes the contact pad 242, i.e., routing layer 7, and a relief film 562 is applied above the contact pad 242 and the laser stop 560. In some examples the laser stop 560 may be formed from the same conductive material which forms the circuit traces, e.g., copper, and the relief film 562 may be formed from high temperature tape.

At operation 460 the receptacle is formed by removing or more layers of the laminate stack. In some examples the receptacle may be formed using a laser removal process to remove the material above the relief film 562 according to the size of receptacle. The relief film 262 may then be removed from the laminate stack.

Figure 5C:
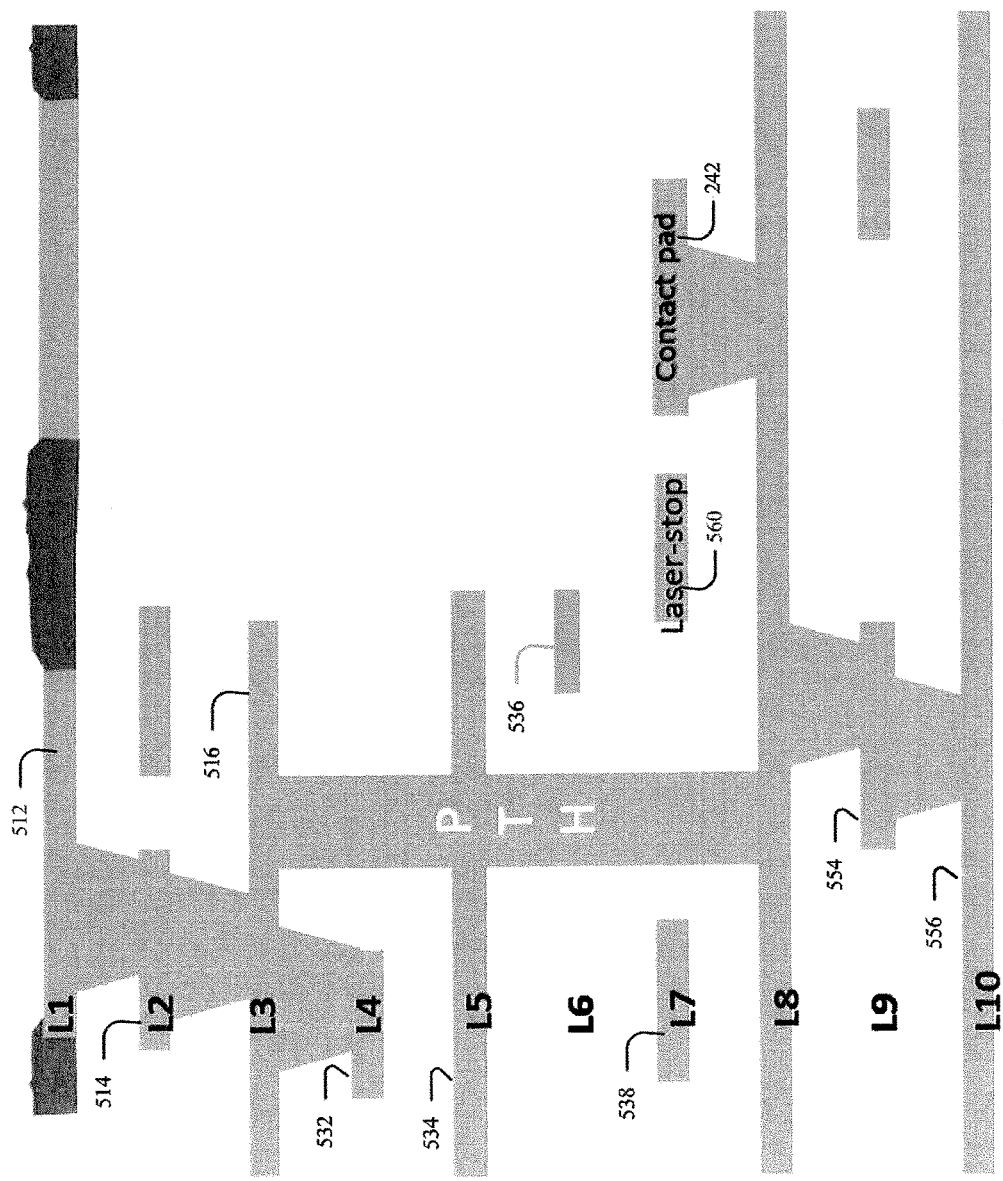

At operation 560 the laminate stack is completed by adding a laminate layer on top of routing layer L2 and the routing layer L1 on top of the laminate layer, resulting in the structure depicted in FIG. 5C.

Thus, the subject matter described herein provides a structure for and methods to make an integrated connector for a printed circuit board assembly. Such structure and methods may find utility, e.g., in the design and manufacture of electronic devices with a thin form factor.

Figure 6:
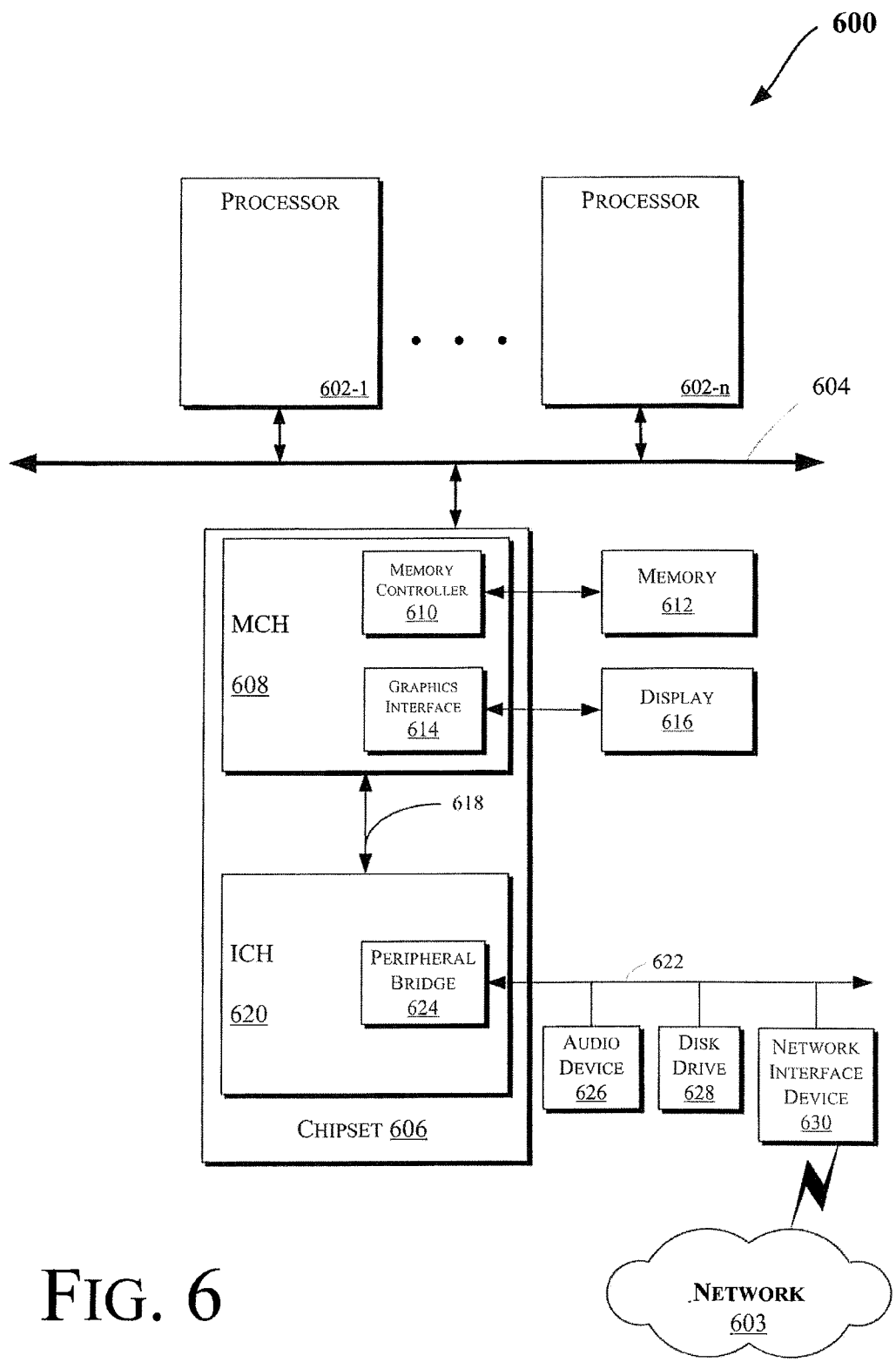
FIGS. 6-10 are schematic illustrations of electronic devices which may be adapted to implement an integrated connector in accordance with some examples.

As described above, in some examples the electronic device may be embodied as a computer system. FIG. 6 illustrates a block diagram of a computing system 600 in accordance with an example. The computing system 600 may include one or more central processing unit(s) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an example, one or more of the processors 602 may be the same or similar to the processors 122 of FIG. 1.

A chipset 606 may also communicate with the interconnection network 604. The chipset 606 may include a memory control hub (MCH) 608. The MCH 608 may include a memory controller 610 that communicates with a memory 612 (which may be the same or similar to the memory 140 of FIG. 1). The memory 612 may store data, including sequences of instructions, that may be executed by the processor 602, or any other device included in the computing system 600. In one example, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple processor(s) and/or multiple system memories.

The MCH 608 may also include a graphics interface 614 that communicates with a display device 616. In one example, the graphics interface 614 may communicate with the display device 616 via an accelerated graphics port (AGP). In an example, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the processor 602 and peripheral devices. Other types of topologies may be utilized. Also, multiple buses may communicate with the ICH 620, e.g., through multiple bridges or controllers. Moreover, other peripherals in communication with the ICH 620 may include, in various examples, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some examples. In addition, the processor 602 and one or more other components discussed herein may be combined to form a single chip (e.g., to provide a System on Chip (SOC)). Furthermore, the graphics accelerator 616 may be included within the MCH 608 in other examples.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
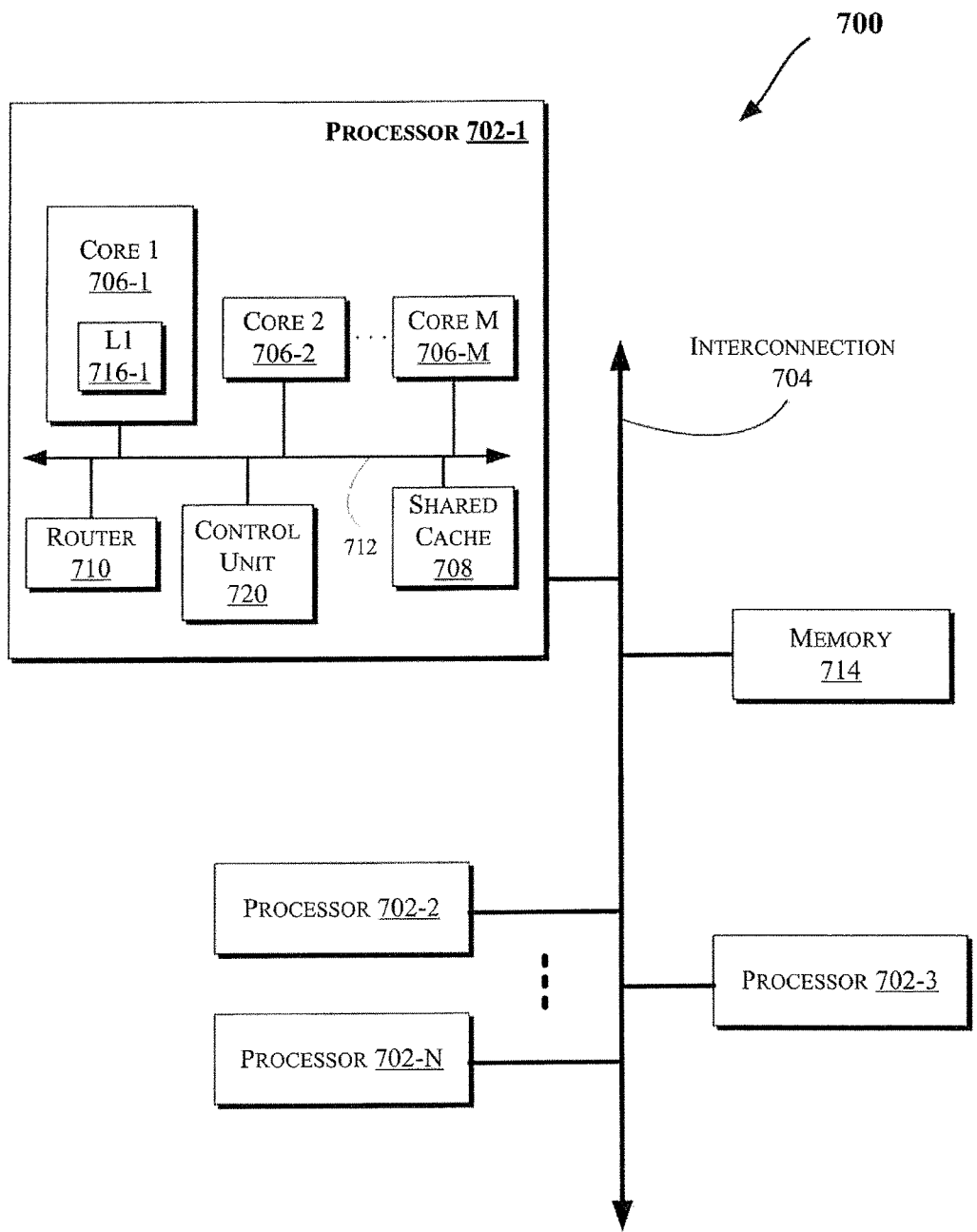

FIG. 7 illustrates a block diagram of a computing system 700, according to an example. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an example, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one example, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an example, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some examples, one or more of the cores 706 may include a level 1 (L1) cache 716-1 (generally referred to herein as "L1 cache 716").

Figure 8:
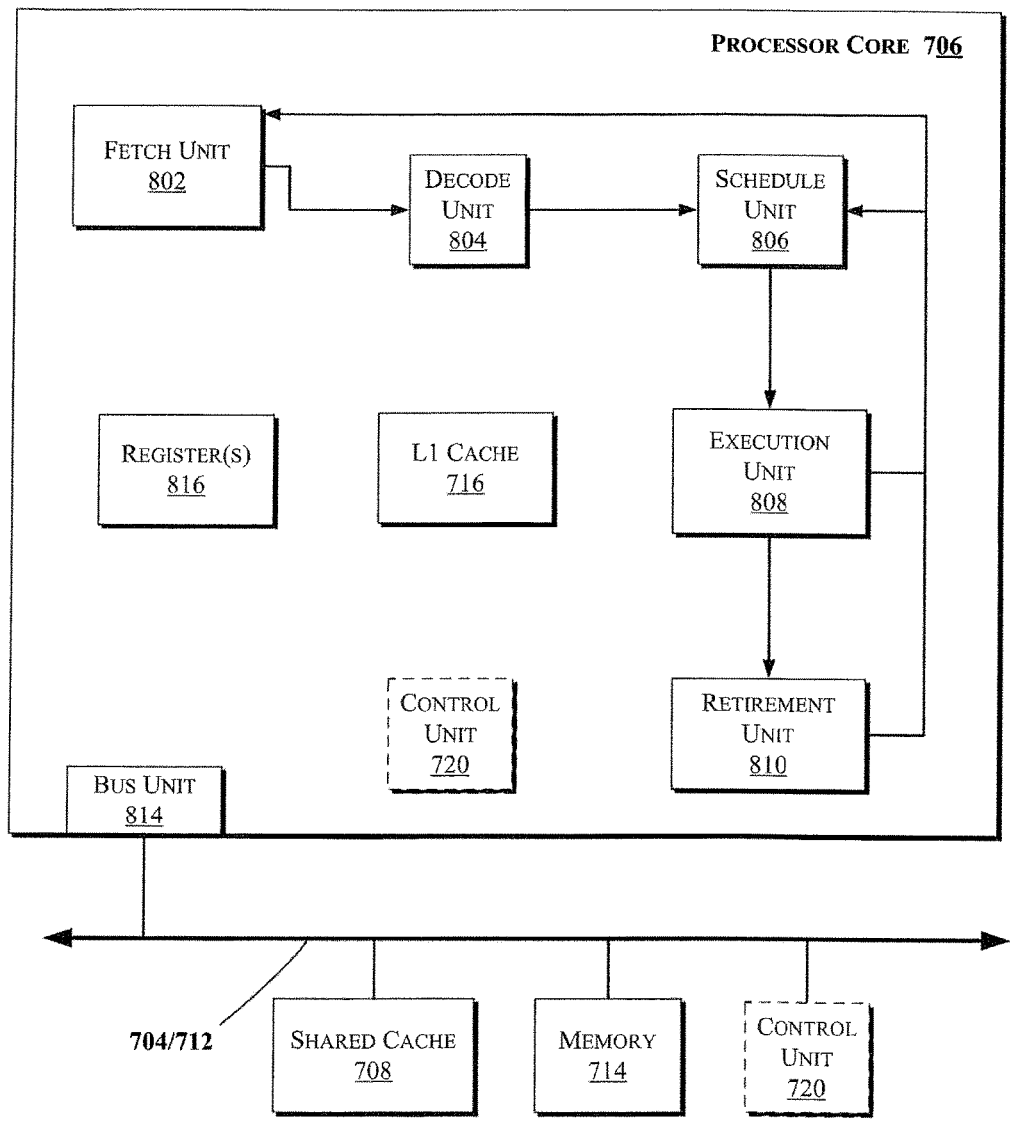

FIG. 8 illustrates a block diagram of portions of a processor core 706 and other components of a computing system, according to an example. In one example, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 712 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one example, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an example, the execution unit 808 may include more than one execution unit. The execution unit 808 may also perform various arithmetic operations such as addition, subtraction, multiplication, and/or division, and may include one or more an arithmetic logic units (ALUs). In an example, a co-processor (not shown) may perform various arithmetic operations in conjunction with the execution unit 808.

Further, the execution unit 808 may execute instructions out-of-order. Hence, the processor core 706 may be an out-of-order processor core in one example. The core 706 may also include a retirement unit 810. The retirement unit 810 may retire executed instructions after they are committed. In an example, retirement of the executed instructions may result in processor state being committed from the execution of the instructions, physical registers used by the instructions being de-allocated, etc.

The core 706 may also include a bus unit 814 to enable communication between components of the processor core 706 and other components (such as the components discussed with reference to FIG. 8) via one or more buses (e.g., buses 704 and/or 712). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 712, in various examples the control unit 720 may be located elsewhere such as inside the core 706, coupled to the core via bus 704, etc.

Figure 9:
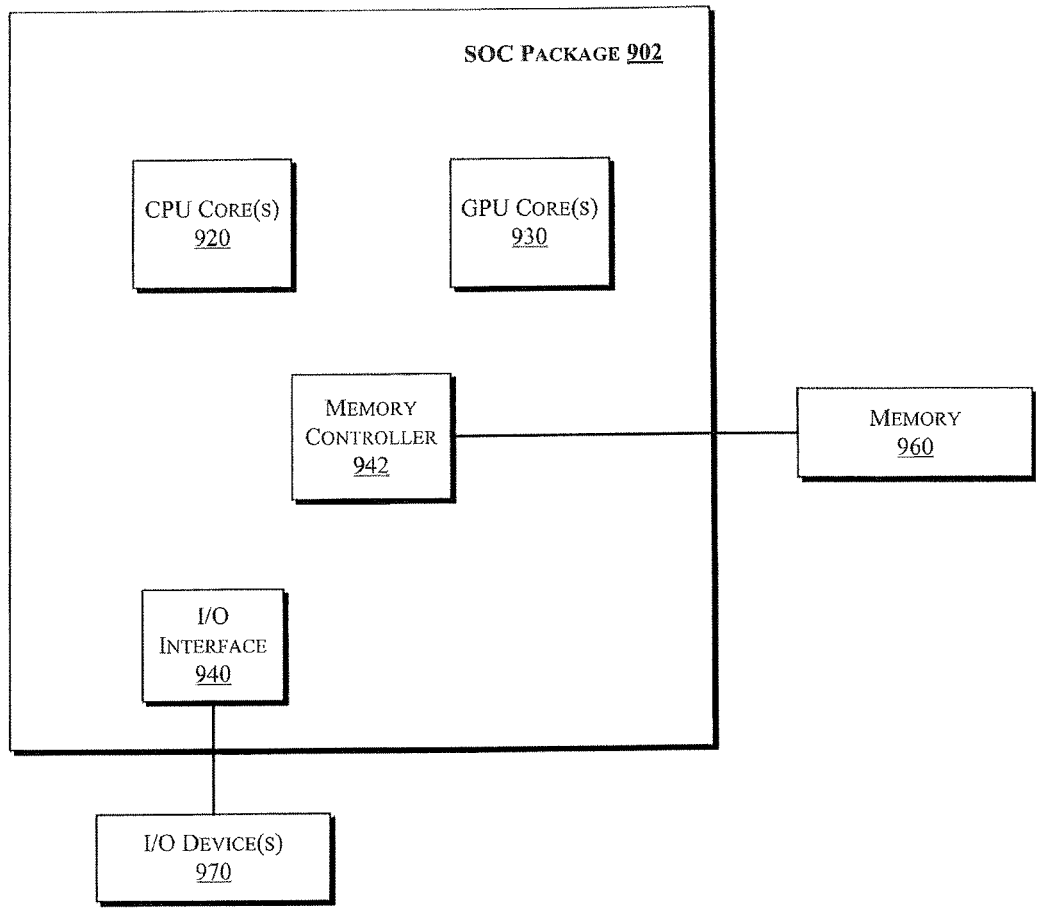

In some examples, one or more of the components discussed herein can be embodied as a System On Chip (SOC) device. FIG. 9 illustrates a block diagram of an SOC package in accordance with an example. As illustrated in FIG. 9, SOC 902 includes one or more processor cores 920, one or more graphics processor cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one example, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an example, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device (s) 970 may include one or more of a keyboard, a mouse, a touchpad, a display, an image/video capture device (such as a camera or camcorder/video recorder), a touch surface, a speaker, or the like.

Figure 10:
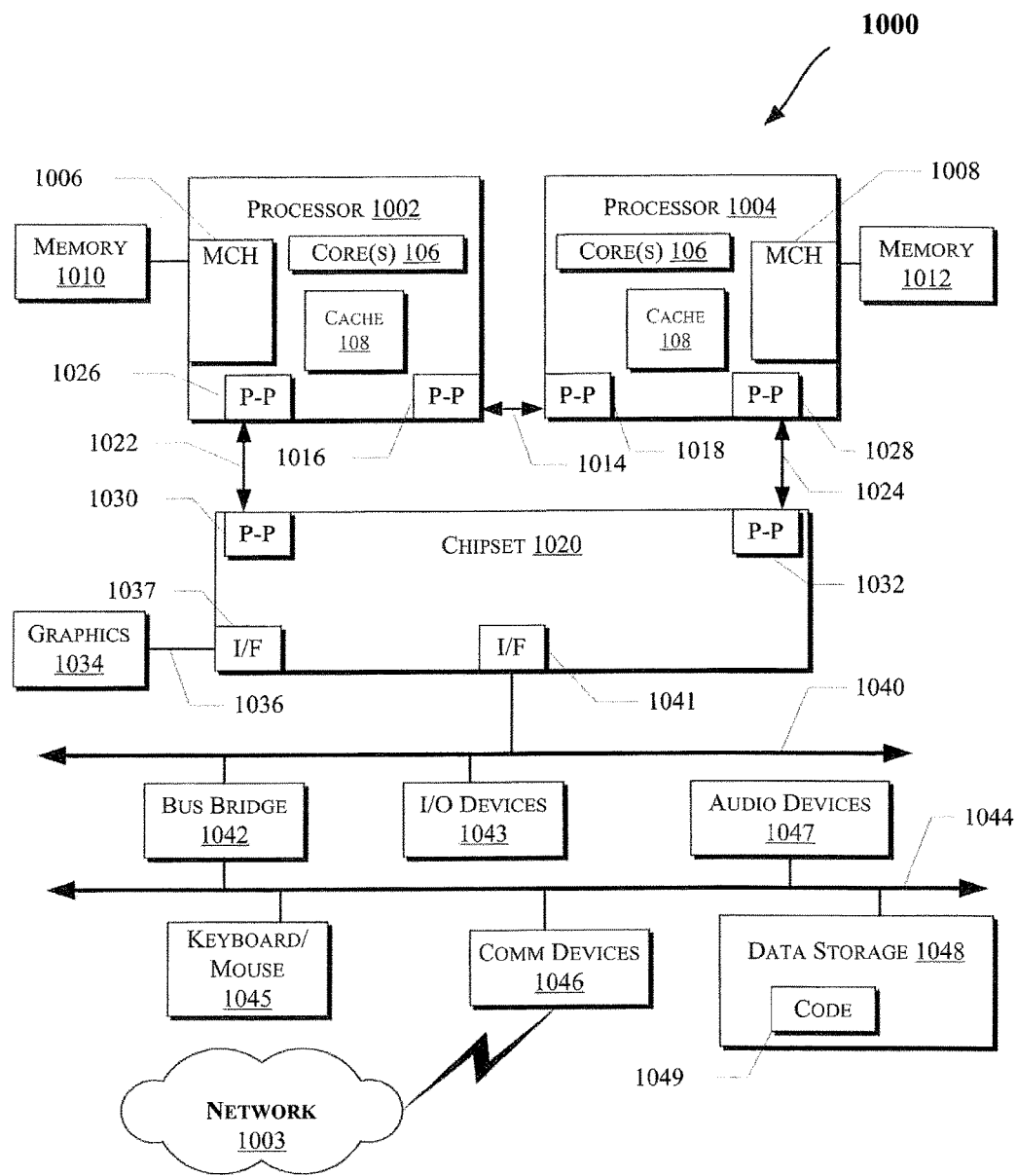

FIG. 10 illustrates a computing system 1000 that is arranged in a point-to-point (PtP) configuration, according to an example. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012.

In an example, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 may be located within the processors 1004. Other examples, however, may exist in other circuits, logic units, or devices within the system 1000 of FIG. 10. Furthermore, other examples may be distributed throughout several circuits, logic units, or devices illustrated in FIG. 10.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1042 may communicate with other devices such as a keyboard/mouse 1045, communication devices 1046 (such as modems, network interface devices, or other communication devices that may communicate with the computer network 1003), audio I/O device, and/or a data storage device 1048. The data storage device 1048 (which may be a hard disk drive or a NAND flash based solid state drive) may store code 1049 that may be executed by the processors 1004.

The following pertain to further examples.

Example 1 is an electronic device, comprising a chassis and a printed circuit board coupled to the chassis and comprising a body formed from a plurality of laminate layers and at least one receptacle formed in the body and comprising at least one data connector positioned in the receptacle to provide a communication connection.

In Example 2, the subject matter of Example 1 can optionally include an arrangement in which the receptacle is formed in a side surface of the printed circuit board.

In Example 3, the subject matter of any one of Examples 1-2 can optionally include an arrangement in which the receptacle comprises at least one of a power receptacle, a universal serial bus (USB) receptacle, an audio/visual (AV) receptacle, or an Ethernet receptacle.

In Example 4, the subject matter of any one of Examples 1-3 can optionally include an arrangement in which the at least one data connector is formed as a trace on the printed circuit board.

In Example 5, the subject matter of any one of Examples 1-4 can optionally include an arrangement in which the receptacle comprising a locking slot to receive a locking pin mounted on a connector which fits into the receptacle.

In Example 6, the subject matter of any one of Examples 1-5 can optionally include an arrangement in which the locking pin is biased in a first direction such that the locking pin is in a first position.

In Example 7, the subject matter of any one of Examples 1-6 can optionally include an arrangement in which the locking pin is positioned such that inserting the connector into the receptacle moves the locking pin from the first position to a second position in which the locking pin is under strain.

In Example 8, the subject matter of any one of Examples 1-7 can optionally include an arrangement in which the locking pin is positioned such that inserting the connector into the receptacle positions the locking pin over the locking slot such that the locking pin moves from the second position back to the first position.

In Example 9, the subject matter of any one of Examples 1-8 can optionally include an arrangement in which the printed circuit board is formed from multiple laminate layers and the receptacle is formed by removing a portion of the at least one of the laminate layers before the printed circuit board is assembled.

In Example 10, the subject matter of any one of Examples 1-9 can optionally include an arrangement in which the printed circuit board is formed from multiple laminate layers and the receptacle is formed by removing a portion of the at least one of the laminate layers after the printed circuit board is assembled.

Example 11 is a printed circuit board comprising a body formed from a plurality of laminate layers, at least one receptacle formed in the body and comprising at least one data connector positioned in the receptacle to provide a communication connection.

In Example 12, the subject matter of Example 11 can optionally include an arrangement in which the receptacle is formed in a side surface of the printed circuit board.

In Example 13, the subject matter of any one of Examples 11-12 can optionally include an arrangement in which the receptacle comprises at least one of a power receptacle, a universal serial bus (USB) receptacle, an audio/visual (AV) receptacle, or an Ethernet receptacle.

In Example 14, the subject matter of any one of Examples 11-13 can optionally include an arrangement in which the at least one data connector is formed as a trace on the printed circuit board.

In Example 15, the subject matter of any one of Examples 11-14 can optionally include an arrangement in which the receptacle comprising a locking slot to receive a locking pin mounted on a connector which fits into the receptacle.

In Example 16, the subject matter of any one of Examples 11-15 can optionally include an arrangement in which the locking pin is biased in a first direction such that the locking pin is in a first position.

In Example 17, the subject matter of any one of Examples 11-16 can optionally include an arrangement in which the locking pin is positioned such that inserting the connector into the receptacle moves the locking pin from the first position to a second position in which the locking pin is under strain.

In Example 18, the subject matter of any one of Examples 11-17 can optionally include an arrangement in which the locking pin is positioned such that inserting the connector into the receptacle positions the locking pin over the locking slot such that the locking pin moves from the second position back to the first position.

In Example 19, the subject matter of any one of Examples 11-18 can optionally include an arrangement in which the printed circuit board is formed from multiple laminate layers and the receptacle is formed by removing a portion of the at least one of the laminate layers before the printed circuit board is assembled.

In Example 20, the subject matter of any one of Examples 11-19 can optionally include an arrangement in which the printed circuit board is formed from multiple laminate layers and the receptacle is formed by removing a portion of the at least one of the laminate layers after the printed circuit board is assembled.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and examples are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and examples are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and examples are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular examples, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one example" or "some examples" means that a particular feature, structure, or characteristic described in connection with the example is included in at least an implementation. The appearances of the phrase "in one example" in various places in the specification may or may not be all referring to the same example.

Although examples have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:
1. An electronic device, comprising:
a chassis;
a central processing unit which executes an operating system;

a controller, separate from the central processing unit, which implements a trusted execution environment that is segregated from the central processing unit; and a printed circuit board coupled to the chassis and comprising:
  a body formed from a plurality of laminate layers; and
  at least one receptacle formed in the body and comprising at least one data connector positioned in the receptacle to provide a communication connection and a locking slot to receive a locking pin mounted on a connector which fits into the receptacle, wherein:
    the at least one data connector is formed as a trace on the printed circuit board; and
    the locking pin is positioned such that inserting the data connector into the receptacle moves the locking pin from the first position to a second position in which the locking pin is under strain.

2. The electronic device of claim 1, wherein the receptacle is formed in a side surface of the printed circuit board.

3. The electronic device of claim 1, wherein the receptacle comprises at least one of a power receptacle, a universal serial bus (USB) receptacle, an audio/visual (AV) receptacle, or an Ethernet receptacle.

4. The electronic device of claim 1, wherein the locking pin is biased in a first direction such that the locking pin is in a first position.

5. The electronic device of claim 1, wherein the locking pin is positioned such that inserting the connector into the receptacle moves the locking pin from the first position to a second position in which the locking pin is under strain.

6. The electronic device of claim 5, wherein the locking pin is positioned such that inserting the connector into the receptacle positions the locking pin over the locking slot such that the locking pin moves from the second position back to the first position.

7. The electronic device of claim 1, wherein:
the printed circuit board is formed from multiple laminate layers; and
the receptacle is formed by removing a portion of the at least one of the laminate layers before the printed circuit board is assembled.

8. The electronic device of claim 1, wherein:
the printed circuit board is formed from multiple laminate layers; and
the receptacle is formed by removing a portion of the at least one of the laminate layers after the printed circuit board is assembled.

9. A printed circuit board, comprising:
a body formed from a plurality of laminate layers;
at least one receptacle formed in the body and comprising at least one data connector positioned in the receptacle to provide a communication connection and a locking slot to receive a locking pin mounted on a connector which fits into the receptacle, wherein:
  the at least one data connector is formed as a trace on the printed circuit board; and
  the locking pin is positioned such that inserting the data connector into the receptacle moves the locking pin from the first position to a second position in which the locking pin is under strain;
a central processing unit which executes an operating system; and
a controller, separate from the central processing unit, which implements a trusted execution environment that is segregated from the central processing unit.

10. The printed circuit board of claim 9, wherein the receptacle is formed in a side surface of the printed circuit board.

11. The printed circuit board of claim 9, wherein the receptacle comprises at least one of a power receptacle, a universal serial bus (USB) receptacle, an audio/visual (AV) receptacle, or an Ethernet receptacle.

12. The printed circuit board of claim 9, wherein the at least one data connector is formed as a trace on the printed circuit board.

13. The printed circuit board of claim 9, wherein the locking pin is biased in a first direction such that the locking pin is in a first position.

14. The printed circuit board of claim 9, wherein the locking pin is positioned such that inserting the connector into the receptacle positions the locking pin over the locking slot such that the locking pin moves from the second position back to the first position.

15. The printed circuit board of claim 9, wherein:
the printed circuit board is formed from multiple laminate layers; and
the receptacle is formed by removing a portion of the at least one of the laminate layers before the printed circuit board is assembled.

16. The printed circuit board of claim 9, wherein:
the printed circuit board is formed from multiple laminate layers; and
the receptacle is formed by removing a portion of the at least one of the laminate layers after the printed circuit board is assembled.

* * * * *